United States Patent [19]

Stokes et al.

[11] Patent Number: 4,947,073
[45] Date of Patent: Aug. 7, 1990

[54] SAW CHANNELIZED FILTERS

[75] Inventors: Robert B. Stokes, Torrance; Kuo-Hsiung Yen, Manhattan Beach; Kei-Fung Lau, Harbor City, all of Calif.

[73] Assignee: TRW Inc., Redondo Beach, Calif.

[21] Appl. No.: 152,127

[22] Filed: Feb. 4, 1988

[51] Int. Cl.⁵ ............................................. H01L 41/04
[52] U.S. Cl. ................................. 310/313 R; 333/154; 310/313 B; 310/313 C
[58] Field of Search ........... 310/313 R, 313 B, 313 C, 310/313 D; 333/150–155, 193–196

[56] References Cited

U.S. PATENT DOCUMENTS

| | | | |
|---|---|---|---|
| 3,755,761 | 8/1973 | Hartmann | 310/313 C X |
| 3,803,395 | 4/1974 | Quate | 310/313 B X |
| 3,919,669 | 11/1975 | Hartemann | 333/154 |
| 4,499,393 | 2/1985 | Stokes et al. | 333/154 X |
| 4,506,239 | 3/1985 | Cho et al. | 333/154 X |
| 4,697,115 | 4/1987 | Mitsutsuka | 310/313 R |

*Primary Examiner*—Thomas H. Tarcza
*Assistant Examiner*—David Cain
*Attorney, Agent, or Firm*—Noel F. Heal; Ronald L. Taylor

[57] ABSTRACT

A surface acoustic wave (SAW) device and a related method, for providing improved frequency response characteristics from a SAW spectrum analyzer or channelizer. The device includes a spectrum analyzer with a preprocessing SAW device configured to provide output signals with narrower passbands, lower sidelobe components, or both. The preprocessing SAW device is a tapped delay line in one embodiment, to simulate positional offsets in the placement of input transducers of the analyzer. The tapped delay line can also be used to provide amplitude weighting or can be configured in a chirp spacing, to transform the spectrum analyzer into a chirp analyzer. Another embodiment employs a thinned-electrode prefilter as the preprocessing device, to yield a frequency response with multiple narrow passbands, which are used to narrow the individual channel passbands of the spectrum analyzer or to suppress sidelobes in the frequency response.

8 Claims, 3 Drawing Sheets

SAW CHANNELIZED FILTERS

CROSS-REFERENCES TO RELATED APPLICATIONS

This application is related to the following applications, both of which are assigned to the same assignee as the present application:
(1) Surface Acoustic Wave Spectrum Analyzer, Ser. No. 580,575, filed Feb. 15, 1984, Yen et al., now issued as U.S. Pat. No. 4,499,393;
(2) Signal Processing System and Method, Ser. No. 529,066, filed Sept. 2, 1983, Brooks, now issued as U.S. Pat. No. 4,541,687.

BACKGROUND OF THE INVENTION

This invention relates generally to surface acoustic wave (SAW) devices and, more particularly, to SAW devices used as radio-frequency (rf) channelizers or spectrum analyzers. A basic form of these devices was disclosed in two prior applications assigned to the same assignee as the present invention, and cross-referenced as the first two listed applications.

Although the cross-referenced applications are not necessarily prior art with respect to the present invention, it is important to understand the principles and limitations of the devices they disclose. SAW devices employ substrates of a piezoelectric material, across which elastic surface waves are propagated between sets of electro-acoustic transducers disposed on the substrate surface. The surface waves, called Rayleigh waves, have an amplitude of displacement that is largest right at the substrate surface. In a piezoelectric material, deformations induced by the waves induce local electric fields, which are propagated with the acoustic waves and extend into space above the surface of the material. These electric fields will interact with electrodes disposed on the surface of the material, to serve as electrical input and output transducers for the surface acoustic wave device.

Although most SAW devices are "in-line" devices employing a single propagation direction, SAW technology can also be applied to diffraction-effect devices, such as spectrum analyzers. SAW spectrum analyzers are disclosed in the the first two cross-referenced applications. Related principles are discussed in a paper by P. Hartemann et al., "Wave-front Synthesis and Reconstruction Using Acoustic Surface Waves," 1977 Ultrasonics Symposium Proceedings, IEEE Cat. #77CH1264-1SU, pp. 840–42. The paper also discloses the use of a tapped delay line for purposes of experimental analysis of spectrum analyzer operation.

SAW spectrum analyzers operate on a principle closely analogous to that of an optical diffraction grating, in which a beam of white light is dispersed into a continuum of separate monochromatic sub-beams. Basically, the channelizer device includes a curved array of input transducers located on a piezoelectric substrate. The transducers are effectively point sources of acoustic radiation, and can be considered to radiate circular wavefronts if the anisotropic nature of most SAW substrate materials is neglected. Wavefronts from all of the input transducer elements reach a zero-order focal point at the same time and reinforce each other. The zero-order focal point is, therefore, at the center of curvature of the input transducer array. At a first-order focal point, displaced from the zero-order focal point, wavefronts from two adjacent transducers still arrive in phase with each other, but their path lengths differ by one complete wavelength. For higher orders of diffraction, the path lengths differ by integral multiples of a wavelength. If the frequency of the signal applied to the input array is changed, the first-order focal point is shifted laterally with respect to the zero-order focal point. If a wideband input signal is applied to the input array, the focal point becomes a focal arc, and each point on the arc represents a different input frequency. Output transducers are arrayed along the focal arc, and each is responsive to a narrow band of frequencies.

If the distances between adjacent input transducers and the focus are offset by a one wavelength spacing, the device is said to operate in the first diffraction order. Operation in the second diffraction order is obtained by offsetting adjacent input transducers by two wavelengths, and so forth. Higher diffraction orders result in a narrower spread of frequency over the output transducers. Stated another way, higher diffraction orders yield a desirably higher frequency sensitivity, or smaller fractional frequency spread at the output transducers. Unfortunately, however, much higher diffraction orders require that the input transducer array be spread over a greater area of the substrate, and devices operating at high diffraction orders are impractical for this reason. Prior to this invention, channelizers or spectrum analyzers have not been able to achieve extremely narrow frequency channels, less than one per cent, with good sidelobe suppression between channels, preferably greater than 50 dB (decibels).

Accordingly, there is still a need for improvement in acoustic channelizer devices, and the present invention satisfies this need.

SUMMARY OF THE INVENTION

The present invention resides in an acoustic channelizer or filter having improved narrowband characteristics but without the difficulties usually associated with operating at higher diffraction orders. Briefly, and in general terms, the device of the invention includes a SAW channelizer having a substrate, a wideband input transducer array for receiving an input signal and an output transducer array for providing a plurality of narrowband output signals derived from the input signal; and an in-line SAW device for preprocessing the input signal before coupling to the channelizer, to provide a desired narrowband frequency response.

In one embodiment of the invention, the preprocessing device is a SAW tapped delay line, which is employed in conjunction with an input array in which there need be no offset between adjacent cells. As in the devices disclosed in the cross-referenced applications, each cell of the input array is a point-source transducer. The cells are arrayed equidistantly from a nominal focal point. Phase offsets equivalent to higher diffraction orders are obtained as a result of the tapped delay line. When a wide band of frequencies is applied to the device, the resulting acoustic waves are spread along a focal arc through the nominal focal point, but the spectral density along the line is much lower than could be obtained without the use of the tapped delay line. The device also includes an array of output transducers to receive the spectral channels of acoustic signals and convert them back into electrical form.

In variant forms of this embodiment, the taps may be placed in the delay line according to a chirp rule, rather than being uniformly spaced, in which case the device will be responsive to signal chirps, which are signals that start at one frequency and sweep to another, usually at a linear rate. By appropriate selection of the delays in the tapped delay line, a chirp applied to the device will emerge as a compressed pulse at one of the output transducers. Moreover, each output transducer is responsive to a different chirp rate, and the entire device functions as a chirp analyzer rather than a spectrum analyzer.

In accordance with another aspect of the invention, the taps of the delay line are amplitude weighted to provide less amplitude at the ends and more at the center of the input array. This can be done in any smoothly varying manner, such as Hamming weighting. The resulting acoustic beam from the input array is a focused one, with relatively low sidelobes. Although this result can be obtained by weighting the spectrum analyzer itself, it is easier to obtain the result by weighting the delay line.

In accordance with the method of the invention the device operates by preprocessing wideband input signals to produce intermediate signals, inputting the intermediate signals into an input transducer array of a SAW spectrum analyzer, and collecting narrowband output signals at multiple output transducers of the spectrum analyzer.

In one embodiment of the method, the step of preprocessing includes simulating spatial offsets in the positions of the input transducers of the spectrum analyzer, by passing the input signals through the tapped delay line to produce intermediate signals that have been selectively phase-shifted before input to the spectrum analyzer. In another embodiment of the method, the step of preprocessing includes prefiltering the input signals, to provide intermediate signals with selected, spaced-apart narrowband characteristics. The prefiltering step may be used to yield intermediate signals with narrower passbands than those of the unmodified spectrum analyzer, or it may be used to yield intermediate signals with pass-bands of approximately the same width as those of the unmodified spectrum analyzer, to provide an output characteristic with substantially reduced sidelobes.

In another embodiment of the device of the invention, the spectrum analyzer is coupled to a thinned-electrode prefilter. The thinned-electrode prefilter provides a frequency characteristic with a number of spaced-apart, periodically repeating, but relatively narrow passbands in the frequency domain. When this frequency characteristic is combined with that of the spectrum analyzer itself, the output transducers provide very narrow passband channels, with relatively large gaps between them. When multiple devices are used, to provide interleaved characteristics of the same type, a spectrum analyzer can be provided with a large number of very narrow channels.

In yet another embodiment of the invention, the thinned-electrode prefilter is employed to provide a high-rejection spectrum analyzer with relatively wide output channels. The prefilter is tailored to have the same width as the spectral analyzer channels, but has the effect of substantially reducing the magnitude of sidelobes associated with and immediately adjacent to the channels.

It will be appreciated from the foregoing that the present invention represents a significant advance in the field of surface acoustic wave devices. In particular, the invention provides improved spectrum analyzer characteristics by employing a separate SAW component in conjunction with the spectrum analyzer, to provide either relative phase shifts to the input signals applied to the analyzer, or to provide prefiltering that improves the frequency characteristics of the output channels. Other aspects and advantages of the invention will become apparent from the following more detailed description, taken in conjunction with the accompanying drawings.

BRIEF DESCRIPTION OF THE DRAWINGS

FIG. 6c is a graph similar to FIG. 5c, but showing the frequency response characteristic for a single channel of the spectrum analyzer, in combination with a prefilter having the characteristic of FIG. 6a.

DESCRIPTION OF THE PREFERRED EMBODIMENTS

Figure 1:
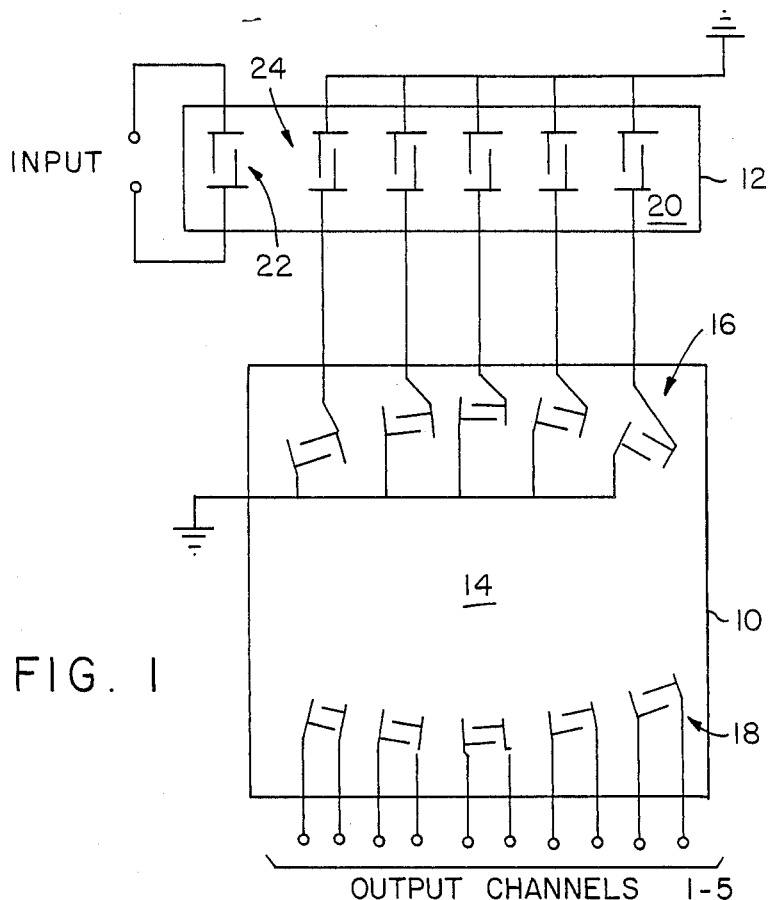
FIG. 1 is a diagrammatic view of a SAW spectrum analyzer in accordance with one embodiment of the present invention.

As shown in the drawings for purposes of illustration, the present invention is concerned with surface acoustic wave (SAW) devices employing diffraction principles for spectrum analysis. Although spectrum analysis can be performed satisfactorily using a diffraction-principle SAW device alone, with an array of input transducers and an array of output transducers, there is still room for improvement in the response characteristics of such devices. In particular, it is desirable to provide output characteristics with a finer frequency resolution and with substantially reduced sidelobes between the desired incremental frequency bands of the output transducers.

In accordance with the invention, a SAW diffraction-principle device, such as a spectrum analyzer or channelizer, is combined with an in-line SAW device to improve the output characteristics of the channelizer. There are basically two embodiments of the invention. In one, the in-line SAW device is a tapped delay line, and in the other the in-line SAW device is a thinned-electrode prefilter.

A first embodiment of the invention is shown in FIG. 1, and includes a SAW channelizer, indicated generally by reference numeral 10, and a SAW tapped delay line, indicated by reference numeral 12. The channelizer 10 includes a piezoelectric substrate 14, an array of input transducers 16 and an array of output transducers 18. The input transducers 16 operate, in effect, as point sources of acoustic energy, and are arrayed on an arc. If the signals applied to the input transducers 16 were all in phase, the acoustic wavefronts would combine additively at a zeroorder focal point located at the center of curvature of the input transducer array. This zero-order focal point does not vary with frequency.

One way of achieving frequency channelization in a channelizer device of this type without using the delay line 12 is to locate the input transducers in such way that they will focus their energy at a first-order focal point. Wavefronts arrive at the first-order focal point in phase, but the distance of adjacent input transducers from the focal point differs by one wavelength. If the frequency of the input signals is varied, the position of the focal point is displaced laterally with respect to the first-order focal point. The focal point then becomes a focal arc, along which output transducers can be arrayed to collect energy in narrow frequency bands.

For further improved frequency resolution, even higher diffraction orders must be used, but higher diffraction orders result in greater spreading of the input transducers, and the device soon becomes impractical to fabricate. In the device of the invention, higher diffraction orders are not attained by positioning of the input transducers On the contrary, the input transducers 16 may be located on a circular arc. Offsets in the positions of the input transducers 16 are simulated by means of the tapped delay line 12, which injects phase delays in the signals, equivalent to the delays that would otherwise have to be obtained by offsetting successive input transducers by multiples of a wavelength.

The tapped delay line 12 includes a piezoelectric substrate 20, an input transducer 22, and a number of output transducers 24 spaced at uniform intervals to provide a delay equivalent to a fixed number of wavelengths at the center frequency of the device. The output transducers are positioned along a focal arc corresponding to a selected diffraction order focal point, and the tapped outputs from the delay line are connected to corresponding ones of the input transducers 16, which radiate acoustic waves that are appropriately delayed with respect to each other to focus the energy at the focal arc on which the output transducers 18 are located.

Although the input transducers 16 are arrayed on the arc of a circle, the focus of their energy may be a second or higher equivalent diffraction order, depending on the spacing of the tapped delay, the tapped delay line output transducers 24. Therefore, the advantages of higher diffraction orders are achieved without the need for large dimensional offsets in the transducer spacings.

Figure 2:
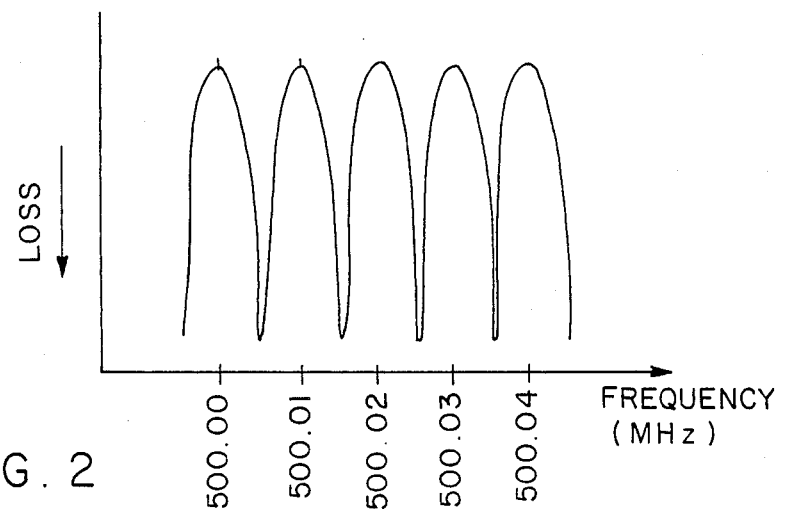
FIG. 2 is a graph showing the output characteristic of the device of FIG. 1.

FIG. 2 shows a typical output characteristic for the device of FIG. 1. Five adjacent channels are shown, with center-to-center spacings of 0.01 MHz (megahertz). This narrow bandwidth of only 0.002% of the nominal frequency is a significant improvement over the approximately 1% band that is typical for such devices.

Figure 3A:
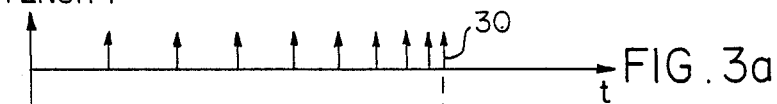
FIGS. 3a-3c are timing diagrams showing operation of the device of the invention in the processing of chirp signals.
Figure 3B:
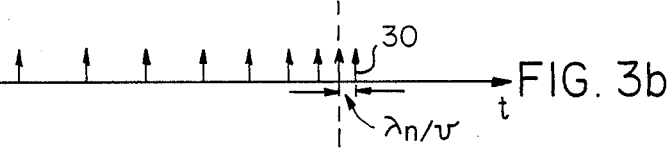
Figure 3C:
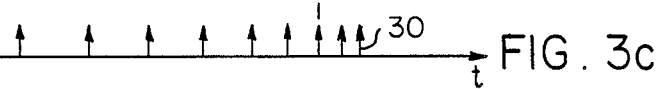

Similar principles may be applied to the processing of chirp signals. In a chirp signal, the frequency increases or decreases linearly from an initial value to a final value. A chirp signal in which the frequency increases provides a series of wavefronts of which the spacing is linearly decreasing. FIG. 3a plots the times of arrival of such a signal at an output transducer. Each signal spike in the figure represents the arrival of a wavefront, and the signal spike 30 represents the arrival time of the last wavefront in the chirp signal. To simplify the explanation, suppose that there are as many input transducers as there are wavefronts in the chirp signal. If the delay line 12 is arranged to provide a delay equivalent to n for the second input transducer in the array, where n is the wavelength measured between the last two wavefronts at the end of the chirp signal, then FIG. 3b shows the effect of this delay on the wavefront arrival times at the output transducer. It will be observed that the second-to-last wavefront from the second transducer arrives at the same time as the last wavefront from the first transducer. The delay in the signal applied to the third input transducer in the array is n-1, and it will be observed in FIG. 3c that this provides a third-to-last wavefront that coincides in time with the second-to-last wavefront from the second transducer and the last wavefront from the first transducer.

Providing each further input transducer with a signal that is delayed in proportion to the distance between two adjacent wavefronts results in coincidence in the arrival times of wavefronts. It will be apparent that this analysis also applies if the number of transducers is not equal to the number of wavefronts in the chirp. The effect of the series of delays supplied by the tapped delay line is to provide a device that is responsive to chirp rates. The delays may be selected such that the output transducer at the principle focus of the device is responsive to a selected chirp rate. Adjacent output transducers will be responsive to other chirp rates, and the device can be employed to sort and identify chirp signals, rather than to operate as a spectrum analyzer.

The taps of the delay line 12 may be amplitude-weighted to provide a more focused beam in the spectrum analyzer. Amplitude weighting of the input transducers 16 is disclosed and claimed in the third cross-referenced application, but weighting of the delay line is a simpler solution to achieve the same result. Amplitude weighting can be effected by any conventional means, such as finger-length weighting. Ideally, the delay line should be amplitude-weighted to provide maximum amplitude at the center and minimum amplitude at the edges of the spectrum analyzer input array. This will tend to reduce the sidelobes of the device. The variation in amplitude can be in accordance with any smoothly varying function, such as a Hamming function.

Another embodiment of the invention employs a thinned-electrode prefilter 40 (FIG. 4) as the additional SAW device combined with the channelizer or spectrum analyzer, indicated at 42. The channelizer 42 is of the type disclosed in the crossreferenced applications, including a substrate 44, an input transducer array 46 and an output transducer array 48. The thinned-electrode prefilter 40 has a substrate 50, an input transducer 52 and an elongated in-line output transducer 54, which is electrically connected to the input transducer array 46.

Figure 4:
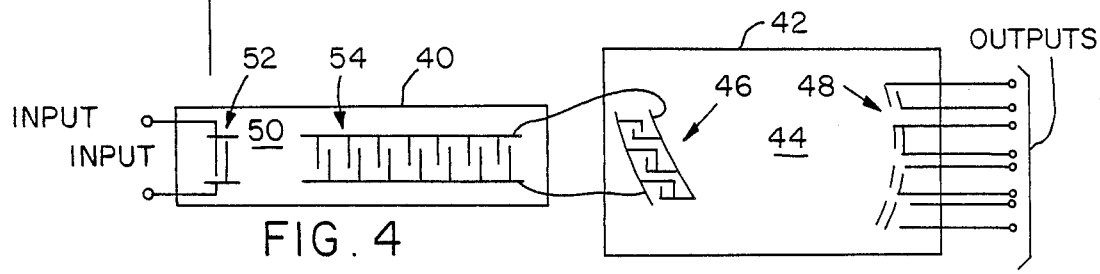
FIG. 4 is a diagrammatic view of spectrum analyzer employing a thinned-electrode prefilter in accordance with an alternative embodiment of the invention.
Figure 5A:
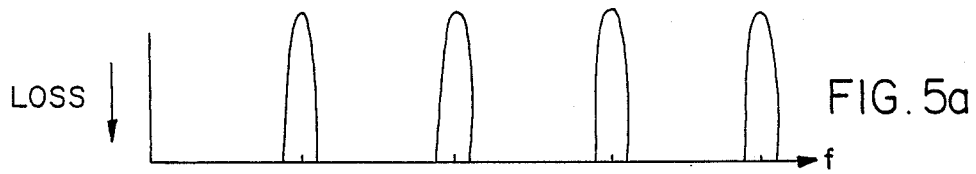
FIG. 5a is a graph showing the frequency response characteristic of the prefilter of FIG. 4.
Figure 5B:
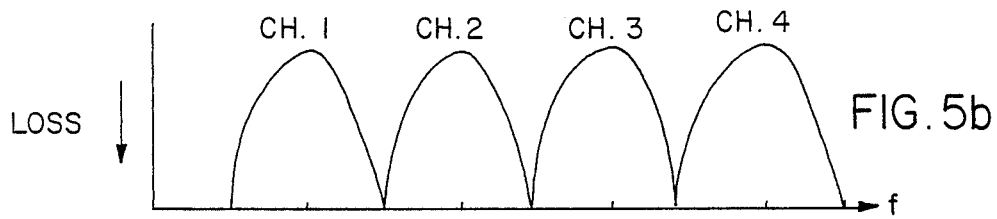
FIG. 5b is a graph showing the frequency response of the spectrum analyzer portion of FIG. 4.
Figure 5C:
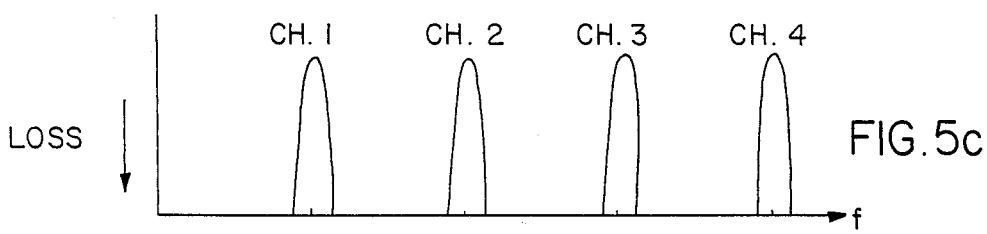
FIG. 5c is a graph showing the frequency response of the prefilter and spectrum analyzer of FIG. 4 operating in combination.

The prefilter 40 is designed t have a frequency response similar to that shown in FIG. 5a, including multiple, spaced-apart, narrow passbands. The channelizer 42 has a response characteristic like that shown in FIG. 5b, comprising multiple passbands that are adjacent but of greater bandwidth than those of the prefilter 40. The combined frequency response characteristic is shown in FIG. 5c. It will be apparent that this technique provides an alternative approach to narrowing the passbands of the channelizer. Most practical applications require that the passbands of the channelizer provide continuous coverage of a frequency spectrum. Accordingly, multiple systems like the one shown in FIG. 4 can be used, each providing a characteristic like that of FIG. 5c, with the peaks of the response curves interleaved to give continuous coverage of the spectrum.

Figure 6A:
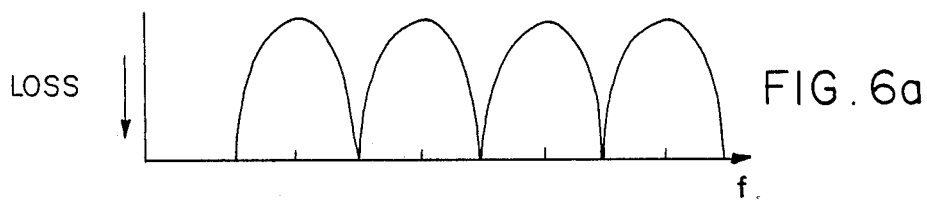
FIG. 6a is a graph similar to FIG. 5a, but showing a modified form of the prefilter frequency response characteristic.
Figure 6B:
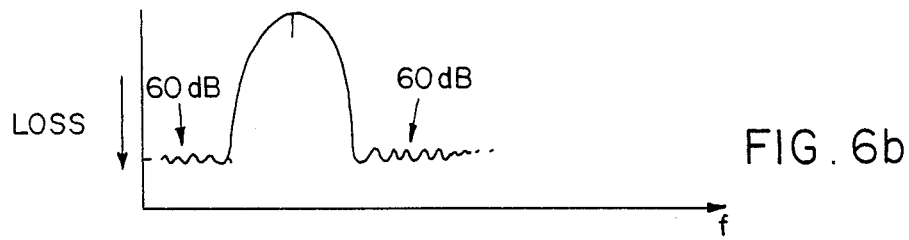
FIG. 6b is a graph similar to FIG. 5b, but showing in more detail the frequency response for a single output channel of the spectrum analyzer of FIG. 4.
Figure 6C:
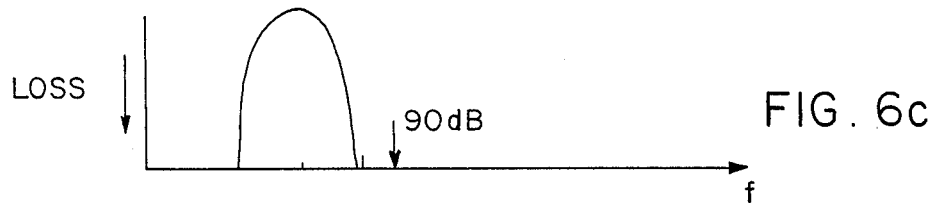

An alternative to the FIG. 4 embodiment is to configure the prefilter 40 to provide much wider passbands, as shown in FIG. 6a, of comparable width to one channel of the channelizer, as shown in FIG. 6b. In practice, each channel of the channelizer has sidelobes, indicated as 60 dB in FIG. 6b. The combined response of the prefilter 40 and the channelizer 42 is shown in FIG. 6c. The sidelobes of FIG. 6b are eliminated in the regions closely adjacent to the channel passbands, and a higher rejection, e.g. 90 dB, is obtained in these regions.

It will be appreciated from the foregoing that the present invention represents a significant advance in the field of SAW devices employed as channelizers or spectrum analyzers. In particular, the use of a tapped delay line or a thinned-electrode prefilter results in improved passband characteristics for the device. The embodiments of the invention provide acoustic spectrum analyzers with extremely narrow channel widths and good sidelobe suppression, using only two SAW devices in combination. Channel shaping of wider bandwidth analyzers is also provided by one form of the invention. It will also be appreciated that, although specific embodiments of the invention have been described in detail for purposes of illustration, various modifications may be made without departing from the spirit and scope of the invention. Accordingly, the invention is not to be limited, except as by the appended claims.

We claim:

1. A surface acoustic wave (SAW) channelizer with narrow-band frequency response, comprising:
    a SAW channelizer having a substrate, a wide-band input transducer array for receiving an input signal and an output transducer array for providing a plurality of narrowband output signals derived from the input signal; and
    an in-line SAW device for preprocessing the input signal before coupling to the channelizer, to provide a desired narrowband frequency response, the in-line SAW device being a tapped delay line, providing signals that are phase-shifted by selected amounts to simulate operation of the channelizer in a higher diffraction order, and therefore with greater frequency discrimination, without the need for large input transducer offsets in the channelizer; and wherein
        the tapped delay line provides a plurality of outputs having incremental phase differences corresponding to a fixed number of wavelengths at a nominal or center frequency of the device,
        the input transducers of the channelizer are located on the arc of a circle, and
        the output transducers are located on an arc passing through the center of the circle.

2. A surface acoustic wave (SAW) channelizer as defined in claim 1, in which:
    the tapped delay line is amplitude-weighted to provide a more focused acoustic beam from the input transducers of the channelizer.

3. A surface acoustic wave (SAW) channelizer as defined in claim 1, in which:
    the tapped delay line has its output transducers spaced by uniformly increasing or decreasing amounts, to simulate operation of the diffraction-effect channelizer as a bank of chirp filters.

4. A surface acoustic wave (SAW) channelizer with narrowband frequency response, comprising:
    a diffraction-effect SAW channelizer having a substrate, a wideband input transducer array for receiving an input signal and an output transducer array for providing a plurality of narrowband output signal derived from the input signal; and
    an in-line SAW device for preprocessing the input signal before coupling to the channelizer, to provide a desired narrowband frequency response, wherein the in-line SAW device is a prefilter providing a frequency response having a plurality of narrow, spaced-apart, passbands;
    and wherein the output of the prefilter is applied to all of the channelizer input transducers;
    and wherein the resulting composite frequency response includes a plurality of narrow, spaced-apart, channel passbands, which may be combined with passbands of similar devices to provide continuous coverage of a selected region of the frequency spectrum.

5. A surface acoustic wave (SAW) channelizer as defined in claim 4, in which:
    the passbands of the prefilter are approximately the same width as those of the unmodified channelizer channels, but with practically no sidelobes close to the passband; and
    the resulting composite frequency response characteristic has passbands of practically the same width as those of the unmodified channelizer channels, but has significantly reduced sidelobes close to the passbands.

6. A method of operating a diffraction-effect surface acoustic wave (SAW) channelizer to produce desirably narrower or better defined passbands, the method comprising the steps of:
    preprocessing wideband input signals to produce intermediate signals, wherein the step of preprocessing includes prefiltering the input signals, to provide intermediate signals with selected, spaced-apart narrowband characteristics;
    inputting the intermediate signals into an input transducer array of a diffraction-effect SAW spectrum analyzer; and
    collecting narrowband output signals at multiple output transducer of the spectrum analyzer.

7. A method as defined in claim 6, in which:
    the step of prefiltering yields intermediate signals with narrow passbands than those of the unmodified spectrum analyzer.

8. A method as set forth in claim 6, in which:
    the step of prefiltering yields intermediate signals with passbands of approximately the same width as those of the unmodified spectrum analyzer, to provide an output characteristic with substantially reduced sidelobes.

* * * * *